(12) United States Patent
Glover

(10) Patent No.: US 9,456,264 B2
(45) Date of Patent: Sep. 27, 2016

(54) HEARING DOSE MANAGEMENT

(75) Inventor: Richard Glover, London (GB)

(73) Assignee: LIMITEAR LIMITED, London (GB)

( * ) Notice: Subject to any disclaimer, the term of this patent is extended or adjusted under 35 U.S.C. 154(b) by 34 days.

(21) Appl. No.: 14/241,956

(22) PCT Filed: Aug. 30, 2012

(86) PCT No.: PCT/GB2012/052121
§ 371 (c)(1),
(2), (4) Date: Jun. 10, 2014

(87) PCT Pub. No.: WO2013/030572
PCT Pub. Date: Mar. 7, 2013

(65) Prior Publication Data
US 2014/0301588 A1 Oct. 9, 2014

(30) Foreign Application Priority Data
Aug. 30, 2011 (GB) .................. 1114915.0

(51) Int. Cl.
H04R 25/00 (2006.01)
H04R 1/10 (2006.01)
H03G 7/00 (2006.01)

(52) U.S. Cl.
CPC ................ *H04R 1/10* (2013.01); *H03G 7/002* (2013.01); *H03G 7/004* (2013.01); *H03G 7/007* (2013.01)

(58) Field of Classification Search
CPC ........... G10K 11/178; G10K 11/1784; G10K 11/1788; G10K 2210/1081; H03G 3/32; H03G 3/24; H03G 9/005; H03G 3/025; H04R 1/008; H04R 1/1016; H04R 1/1041; H04R 1/1083; H04R 5/033; H04R 5/04; H04R 25/356; H04R 25/453; H04R 25/502; H04R 25/505; H04R 27/00; H04R 2225/43; H04R 2420/07
USPC ........... 381/57, 71.1, 71.6, 72, 74, 317, 324, 381/380; 181/129, 130, 135
See application file for complete search history.

(56) References Cited

U.S. PATENT DOCUMENTS

| | | | |
|---|---|---|---|
| 7,817,803 B2 * | 10/2010 | Goldstein ............ | A61B 5/0002 381/72 |
| 2005/0226428 A1 * | 10/2005 | McIntosh ............ | H04M 1/6016 381/55 |
| 2007/0214893 A1 | 9/2007 | Killion | |
| 2007/0274531 A1 | 11/2007 | Camp | |

(Continued)

FOREIGN PATENT DOCUMENTS

| | | |
|---|---|---|
| JP | 58-056511 A | 4/1983 |
| WO | 2008/054069 A1 | 5/2008 |
| WO | 2008/136723 A1 | 11/2008 |

OTHER PUBLICATIONS

International Search Report, dated Feb. 26, 2013 issued in International Application No. PCT/GB2012/052121.

(Continued)

*Primary Examiner* — Brian Ensey
(74) *Attorney, Agent, or Firm* — Saul Ewing LLP

(57) ABSTRACT

A hearing dose management device has an input, an output 6B for feeding an acoustic transducer, and an attenuating device configured to provide a controlled attenuation between the input and the output. The attenuation is dependent on past levels of the output so as to manage a hearing dose delivered by an acoustic transducer.

20 Claims, 7 Drawing Sheets

(56) References Cited

U.S. PATENT DOCUMENTS

2008/0181424 A1 7/2008 Schulein et al.
2010/0150378 A1 6/2010 Lee et al.

OTHER PUBLICATIONS

Lawrence Mayes: "The Field Effect Transistor as a Voltage Controlled Resistor," retrieved from the Internet: URL: http://freespace.virgin.net/ljmayes.mal/comp/vcr.htm [retrieved on Dec. 7, 2012] (Oct. 18, 2002) XP002688976.

Lawrence Mayes: "Audio Compressor," retrieved from the Internet: URL:http://freespace.virgin.net/Ijmayes.mal/comp/comp.htm [retrieved on Dec 7, 2012] (Jan. 13, 2007) XP002688977.

Elliott et al., IP.Com Journal, IP.com Inc., West Henrietta, NU (Jun. 1, 1964) XP013084568.

Leighton, IEEE Journal of Solid-State Circuits, IEEE Service Center, Piscataway, NJ vol. 3, No. 4, pp. 441-447 (Dec. 1, 1968) XP011421679.

\* cited by examiner

HEARING DOSE MANAGEMENT

CROSS REFERENCE TO RELATED APPLICATIONS

This application claims the priority of PCT/GB2012/052121, filed on Aug. 30, 2012, which claims priority to Great Britain Application No. 1114915.0, filed Aug. 30, 2011, the entire contents of each of which is fully incorporated herein by reference.

The present invention relates to hearing dose management.

BACKGROUND TO THE INVENTION

Introduction

It has been well established for many years that hearing can be permanently impaired through prolonged exposure to high sound intensity, or by short bursts of extremely high intensity. Irreversible hearing impairment may not be detected for many years after exposure with the effect being accumulative with contributions from both prolonged exposures and intense peaks. This makes assessment and control of sound pressure levels very important for both the workplace and more general situations.

Guidelines and regulations have been improved as and when new understanding of the effects of sound exposure emerges. Acceptable levels have been generally reduced and the scope of application has broadened. Legislation to control noise in the workplace is common in many countries and has encouraged employers and employees to reappraise exposure to damaging sound pressure levels. Outside the workplace the widespread use of personal listening devices has led to widespread concerns about potential hearing damage with prolonged use.

Legislation in most parts of the world has a similar form based on generally accepted safe levels of sound. Two aspects of the regulatory limits are short-term peak levels, and dose or long-term averaged levels.

Earpiece users experience noise from both the local environment (ambient) and from the electronic sound source being delivered to the earpieces and several approaches to hearing protection are necessary. Ambient noise levels can be suppressed at source which is often encouraged as a first step. They can be suppressed at the ears though the use of appropriate well-fitting earpieces which could be in-ear-monitors (IEMs) or over-the ears headsets.

Acoustic levels delivered by the earpieces can also be limited in various ways, with source-limiting, or various limiting techniques at the earpieces. However, clear communications can be compromised if earpiece generated acoustic levels are limited to the extent that residual ambient noise is too high, either generally or for short periods. This is especially so of some simple limiters applied to earpieces at the present time.

Approaches to Hearing Protection

The most common options are based on an assessment of typical sound levels and are not specific to a particular situation. These do not always deliver as high an audio level as is safe for short periods, and so communications intelligibility can suffer significantly. Other more sophisticated options are more expensive, use more power and are relatively large in size compared with what is convenient in many applications.

Both these factors limit the availability of effective solutions to prevent potentially damaging levels of sound exposure. This invention seeks to make an effective solution more readily available.

Assessing the dose delivered by the earpieces is also usually assessed based on typical content. However the exposure from earpieces is highly variable during each day, between different user's environments and from day to day. These, can help establish appropriate measures to be implemented, but do not deal with any specific user and particular working occasion. In setting a limit for the earpiece dose based on such assessments, the limited level may be insufficient for clear communications, which in some situations can lead to compromised safety. Such solutions fail to make use of the full range of safe dose levels as defined by the legislation.

Protection in the Source Device: The source device such as a radio handset or MP3 player can limit the signal delivered to the earpiece. The most common form of limitation is of voltage, such as a peak level of voltage output to the earpiece. This could be related to the device's output stage capability or to the setting of a volume control. Such schemes rely on 4 basic assumptions: The relationship between peak level and the averaged energy over time, the sensitivity of a particular earpiece, the period of time that the device is in use for, and the frequency content of the audio signal (mid-to high frequencies being more damaging than low frequencies). Mistakes in any of these can result in hearing damage.

Nevertheless, assessments have been made and several radio handsets do incorporate such simple measures. Some can detect different earpieces being connected and make some adjustment for these. However, a test tone at a certain peak level has many times more potential to damage hearing than occasional spoken words at the same peak level. This leads to loss of communication clarity in some adverse ambient noise environments.

Protection in the Earpiece or Headset: Some form of limiting device can be applied either between the source and earpiece, or incorporated in the earpiece itself. There are several types.

The most basic is a fixed attenuator, commonly a fixed series resistance in the earpiece lead. Such a scheme relies on knowledge of the peak drive capabilities of the source device, the average energy over time and frequencies of the programme material and the overall period of exposure. Such an approach often results in either inadequate clarity of communication or inadequate hearing protection.

Simple hard limiters can be fitted, such as cross-coupled diodes. These limit the peak voltage getting to the earpiece, but suffer from all of the problems associated with the above as well as significant distortion of peak signals and inadequacy in terms of limiting acoustic energy in the ear to safe levels.

There are some self-powered level control schemes implemented using voltage-controlled gain devices such as MOSFETs or JFETs. One of the earliest was been designed by the BBC and is available commercially. The level of attenuation is determined by a simple short-term average of the rectified input signal. Acting as a soft limiter, such schemes allow slightly higher acoustic levels for very short periods of time, but then the attenuation brings the level down to a lower level. They do not base the controlled level on the output and are consequently not accurate. The operating limit still has to be based on an assessment of programme content as it is not able to monitor actual dose or respond specifically to accumulated dose. However, they are much better solutions than fixed attenuators. Some variants are not able to work at some of the lower signal levels used in IEMs, but others incorporate transformers which allow the necessary high control voltages to be generated. Some form of individual calibration is necessary to remove the large uncertainties in the MOSFET or JFET control characteristic.

Similar devices and schemes have been incorporated in some headsets to limit peak signal levels to prescribed levels. They have no effect on the programme content until excessive levels occur and are much more effective than the hard limiters described above. However, they do not deal with hearing dose exposure.

Protection Based on Dose Measurement: There are solutions that monitor dose continuously and either provides an indication of dose level or take action to limit the level. Because of the computation necessary to determine dose, these are generally based on sophisticated processing in digital signal processors (DSPs) and hence are relatively expensive in comparison with the cost of many hearing devices, need more power than is easily available in most circumstances, and are bulky. Hence they are not optimum solutions for the majority of earpiece users.

One approach is to incorporate the attenuation function within the DSP. However this necessitates additional power to drive the hearing device. Another approach is for the DSP to control an external attenuator such as a JFET or MOSFET device. This invention could be applicable to such an approach.

Methods of Attenuation

Resistive Attenuator: FIG. 3 shows a fixed attenuator configuration with resistance R1 and the impedance of the earpiece defining the level of attenuation. This reduces the level of the input signal (6A) to produce the drive signal (6B) for the earpiece (1). The common connection (10) is ground in most applications.

Any amount of attenuation is possible through selection of an appropriate value for R1. However this offers no inherent protection for dose or for peak signal levels.

Earpieces do not have constant impedance over their frequency range and are generally designed to work from low source impedances. Hence there is likely to be an undesirable effect on frequency response and audio quality, especially with high levels of attenuation. Such effects can be reduced by applying a resistive shunt element to the earpiece as shown in FIG. 4. For a given level of attenuation, R1 will have a lower value; the impedance presented to both the signal source and to the earpiece will be correspondingly lower. For most applications this will be perfectly acceptable.

Basic Shunt Voltage Controlled Attenuator: Prior art has many forms of a JFET (junction-field-effect-transistor) or MOSFET (metal oxide field effect transistor) in use as a voltage controlled attenuator. A basic configuration is shown in FIG. 5 by way of introduction to the present invention.

Q1 is a MOSFET in this representation, but could be another device such as a JFET or a more complex arrangement embedded within an integrated circuit. One example of this could be a chopping network followed by a low-pass filter.

Q1 has a control terminal (gate-G) and 2 terminals which can act as a variable resistance (RDS) between the drain-D and source-S. In this configuration, Q1's RDS effectively presents a shunt impedance to the earpiece (1). RDS is dependent on the control voltage (5) which thus determines the level of attenuation. When used with AC (alternating current) signals, the control voltage is with respect to ground (10).

MOSFET devices can have a minimum RDS resistance of only a few milliohms whilst JFETs have minimum RDS resistance of a few ohms. Both have extremely high maximum RDS, effectively open-circuit. The range of control voltage for most MOSFETs is between 0V (off or open-circuit RDS) to the gate threshold voltage which could be <1V for logic level devices or several volts for others. For JFETs, the range of control voltages is between 0V (on, minimum RDS) to the gate cut-off voltage, which is likely to be a few volts negative for N-type devices, those with the lowest RDS. J108 for example can have RDS minimum of less than 8 ohms and a gate cut-off voltage anywhere between −3 and −10V, which illustrates the manufacturing variability of such devices.

With only modest values of R1, considerable attenuation is possible with a MOSFET, but relatively modest attenuation with a JFET due to its limited RDS range. However MOSFETs have an integral diode to the substrate that shunts one phase of large AC signals. A back-to-back configuration can be employed to overcome this, but at the expense of additional complexity.

Improving Linearity: JFETs and MOSFETs are typically symmetric when used as a controlled resistance for small signal levels. This implies the control voltage reference point is midway between the voltages of source (S) and drain (D) rather than ground (10).

One well known way of achieving this is illustrated in FIG. 6. A proportion (50%) of the output AC signal is fed to the gate of Q1. If the source impedance of control voltage (5) is low proportion this is achieved with R3=R4. This necessitates the control voltage (5) to be twice that in FIG. 5 for a given level of attenuation. A useful reference to the use of FETs as low-distortion attenuators is Siliconix AN104 (10 Mar. 1997).

It is also well known that a capacitance can be included in series with R3 to isolate any DC between the signal and control sections. The time-constant formed by R3 and the capacitor must be large enough to pass all signal frequencies and yet small enough to block changes in control voltage affecting the signal. For audio applications and where control changes are slow, this is not a problem.

However, even with the above linearization scheme, JFETs and MOSFETs tend to introduce distortion when RDS resistance is high. According to the AN104 reference, this occurs with RDS being over ten times RDS minimum and this can be readily be observed using distortion measuring equipment. With the device set off (extremely high RDS) so that it has no effect on the signal and there is minimum attenuation, then distortion is introduced as small amounts of attenuation are introduced; with greater attenuation the distortion falls away again. If RDS was restricted to a range of 1:10 to minimise distortion, this would significantly restrict available attenuation.

It is possible to configure the JFET or MOSFET as the series element and replacing R1 of FIG. 6. In this situation distortion would be introduced at higher levels of attenuation which may be more acceptable in some applications.

Generation of Gate Control Voltages

Hearing dose management necessitates long-term assessment of hearing dose, most easily achieved in some form of computation device such as a DSP or microcontroller. Logic level MOSFETs can easily be supplied with suitable control voltages within the supply and operating voltages of such devices. However high audio voltage levels are best managed with JFETs that necessitate much higher and negative gate control voltages. Hence some means of generating control voltages with a typical range of 0V to −10V is required. This is usually a simple task, but becomes a significant challenge when the lowest possible power consumption is required. Some general approaches are reviewed here but a novel approach is presented within the details of this invention:

Regulated Supply and High Voltage Amplifier: A high voltage can be created using a switched regulated power supply, either an inductive inverter or a capacitive charge pump; this could be fed from a low supply voltage such as a 3V battery. A low voltage control signal from a microcontroller can then be amplified through a suitable amplification stage to deliver the 0=>−10V.

Most power supply regulation techniques rely on there being a reasonable load on the power supply; the output is actively increased if it is too low, but passively decreased if it is too high through power being drawn by the load. This and the use of relatively high-voltage amplifiers both tend to compromise micro-power applications.

Unregulated Supply and Low Voltage Amplifier: It is possible to use an unregulated power supply and a low-voltage amplifier in conjunction with an external device such as a MOSFET; certain configurations can achieve stable gate drive levels. FIG. 9 shows an inverting voltage conversion stage that can generate gate control voltages from a low voltage control input without needing a regulated supply or high-voltage amplifier.

Apart from the added complexity, such configurations have a limited negative slew rate capability. MOSFET (Q10) is actively involved for positive ramp whilst the resistance (R18) to the negative supply (−12V UNREGULATED) is only passively pulling the voltage down. These would have high values to minimise power consumption and yet low values to rapidly change the voltage on an capacitors associated with the JFET gate control.

A shunt JFET would be able to rapidly attenuate sudden incoming excessive signals; however it would only be able to slowly reduce the attenuation. If a series JFET were used (as in the position of R1 in FIG. 4) then it would be unable to rapidly increase attenuation. For some applications these limitations may be acceptable.

Supply+Pulse-Width Modulation: By using pulse-width modulation in conjunction with a regulated power supply it is possible to transform a logic level output to any voltage within the power supply range with very low power consumption apart from the need to keep the microcontroller or similar device running. This has the advantage of relative simplicity when compared with FIG. 9. The supply in this case could be a regulated 0V to −10V and the logic level could be 0V to +2.5V used by a microcontroller.

Direct Generation of Control Voltage: Rather than have separate power supply to generate the negative voltage and then some form of amplifier to use it to generate the gate control voltage, it is possible to use some form of inverter to generate the voltage directly. Transformers, inductors or capacitors as charge-pumps can all be used. Where control speed is important, these schemes will have a similar problem with rising amplitude ramps being faster than falling amplitude in low-power applications.

Fail Safe Operation: Any system providing protection that depends on power should have some scheme that ensures safe operation in the event of power failure. A shunt MOSFET will normally be enhancement mode and so go to the off-state of high RDS in the event of power failure and loss of the gate control voltage; this would provide minimum attenuation and least protection. A shunt JFET will go the minimum RDS condition with loss of gate control voltage and hence provide some protection on power failure. A series MOSFET would go to higher attenuation on power failure whilst a series JFET would go to minimum attenuation.

Reducing Device Variability

It is well known that MOSFET and JFET characteristics vary significantly from device to device, and to some extent even those in a particular manufacturing batch. It is also well known that these characteristics are highly dependent on temperature. This makes defining a particular control voltage to attain a particular level of attenuation very difficult, without resort to elaborate calibration and temperature compensation schemes. Prior art U.S. Pat. No. 7,750,738 used a configuration of 2 MOSFET devices to overcome all of these issues for integrated circuit designs. As dual MOSFET devices are available in discrete form (eg Fairchild Semiconductors FDS8984, being one of many similar devices), it is possible to make similar arrangements using 2 fairly well matched devices, in terms of both process and having the same temperature.

As previously mentioned, some forms of limiter employing JFETs or MOSFETs include a means of adjustment such as a variable potentiometer so as to compensate for at least variability in control characteristic. It is also possible to automate aspects of this through laser trimming of resistor networks.

Other than this, some means of calibration is necessary. A microcontroller or DSP device allows calibration parameters to be held indefinitely and can be included in simple automated schemes within the contest of manufacturing test.

SUMMARY OF THIS INVENTION

According to an aspect of the invention, there is provided a hearing dose management device as in claim 1. The hearing dose management device can be described as a limiting device.

Preferably, the attenuating device comprises a plurality of voltage or current controlled devices, optionally MOSFETs and/or JFETs, arranged into a series-shunt arrangement to achieve greater ranges of attenuation at low distortion.

Embodiments of the present invention relate to protection devices for hearing, particularly related to noise-dose induced impairment with the use of earpieces or headsets. It seeks to deliver dose-monitoring and dose-based control as well as some measures to protect against acoustic shock. Embodiments of the invention provide low distortion, low-cost, minimal power consumption and small-size, ensuring a wide usage with hearing devices.

An important feature of embodiments of this invention is the proper monitoring of hearing dose over time. Legislation allows dose to be managed over a full day, and by extension, over a week. The use of long time periods enables short bursts of high levels to be used at times, whilst managing the long-term dose to ensure compliance with legal and safety limits.

In embodiments, only sound delivered through the earpiece is included directly. Using other technology it is possible to also include direct ambient noise monitoring and control.

Preferred embodiments of the invention provide a novel protection device that monitors the hearing dose delivered from a hearing device such as an earpiece to the ears over extended periods of time, and controls signal attenuation to ensure hearing damage is prevented. Preferred embodiments provide a low-cost, low-power and low-distortion solution that encourages a more widespread hearing protection through incorporation into hearing devices.

BRIEF DESCRIPTION OF DRAWINGS

Embodiments of the invention are described below, by way of example only, with reference to the accompanying drawings, which show the following.

DETAILED DESCRIPTION OF EMBODIMENTS OF THIS INVENTION

Minimising Distortion

Figure 6:
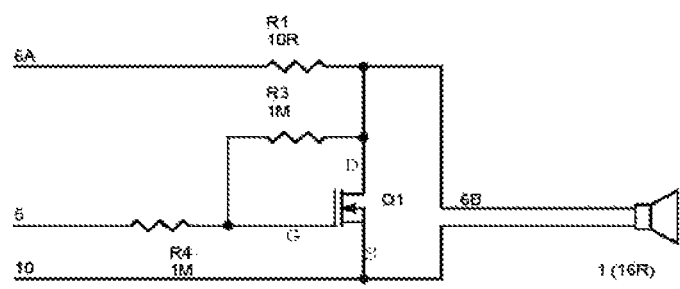
FIG. 6 shows prior art of variable attenuation configuration with improved linearity in the form of a voltage-controlled attenuator with a common form of compensation (R3, R4) to ensure reasonable linearity of the attenuation device (Q1).
Figure 7:
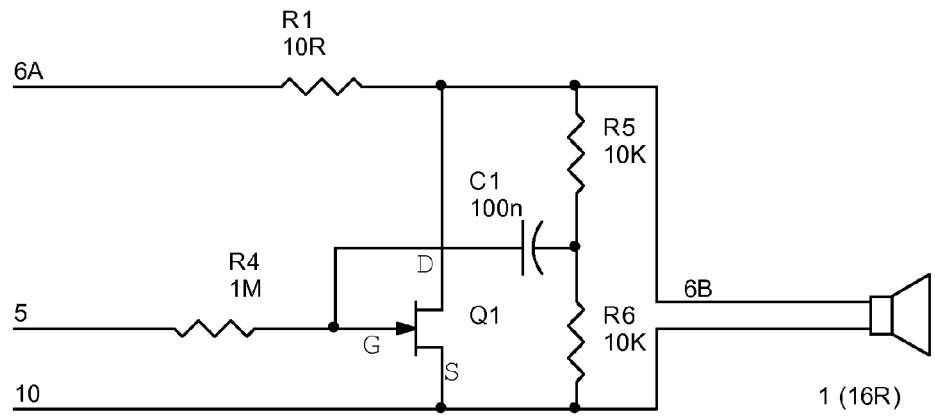
FIG. 7 shows an embodiment of the invention providing the basic voltage-controlled attenuator configuration with an alternative means of achieving reasonable linearity which can be described as variable attenuation configuration with novel linearity scheme.

An alternative scheme to establish the control voltage reference point is shown in FIG. 7. This ensures a control voltage referenced to 0V is re-established as being effectively referenced to the midpoint of the attenuating device source and drain terminals. It is important that the impedance of R4 is significantly higher than the potential divider R5, R6 and that the reactance of C1 is much lower than R4 for the signal frequencies passing to earpiece. One advantage of this scheme is that the control voltage (5) range is effectively the same as the device gate voltage (G), rather than being twice G in the arrangement of FIG. 6. Over practical frequencies and impedances, this can be a very effective configuration and forms part of the novelty being claimed.

Figure 8:
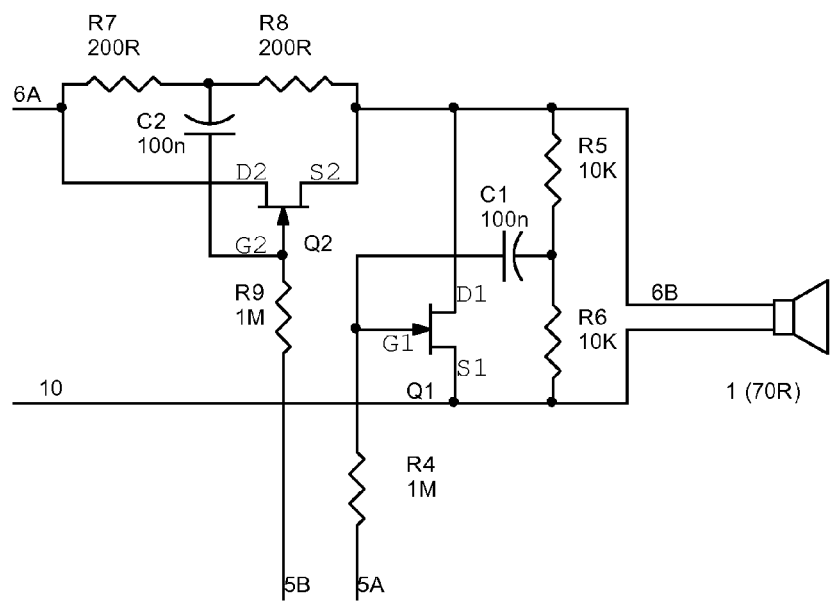
FIG. 8 shows an embodiment of the invention, with a series-shunt combination of voltage-controlled attenuator to improve the range of attenuation with minimum distortion.
Figure 9:
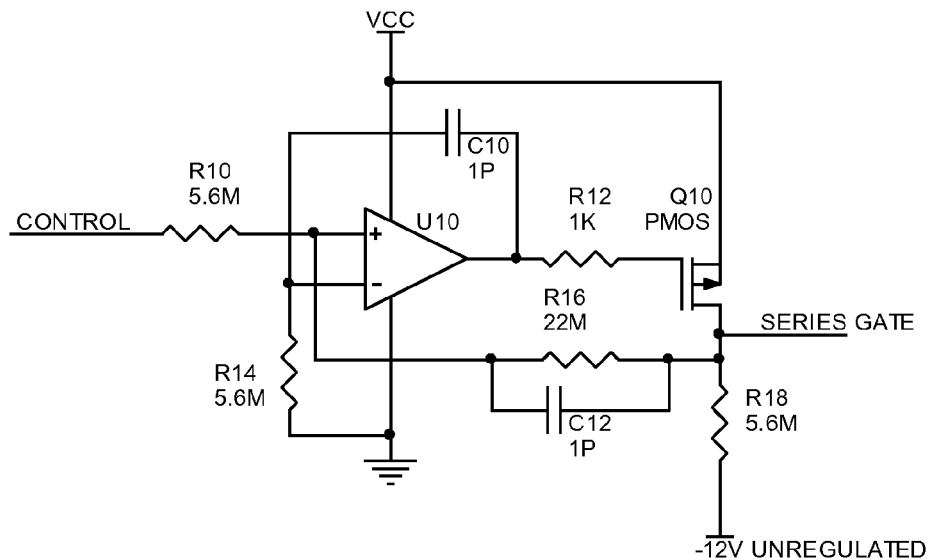
FIG. 9 shows one arrangement of a gate driver for generating JFET gate voltages with an unregulated supply and low-voltage amplifier.

By combining two such configurations in a series—shunt configuration as depicted in FIG. 8 much of the problem of limited attenuation range with minimal distortion is overcome. Q1 is the shunt device as per FIG. 7. Q2 is the series device replacing the series resistance R1 of FIG. 7.

The description here is for the JFET device, but similar configurations are possible for the MOSFET alternative. Note that the most common MOSFET is enhancement mode, it being off (high RDS) with zero gate-source voltage. JFET devices are depletion mode devices, being on (minimum RDS) with zero gate-source voltage.

5A is the shunt DC control voltage with the linearising AC signal being applied via C1 to Q1; the Q1 gate voltage G1 is the shunt control voltage superimposed with the AC midpoint voltage of Q1 source (S1) and drain (D1). For minimum to maximum attenuation (that is for maximum to minimum RDS) using N-channel JFET devices, the shunt control voltage 5A has to move from −10V to 0V.

5B is the series DC control voltage with the linearising AC signal being applied via C2; the Q2 gate voltage G2 being the shunt control voltage superimposed with the AC midpoint voltage of Q2 source (S2) and drain (D2). For minimum to maximum attenuation (that is for minimum to maximum RDS) using N-channel JFET devices, the shunt control voltage 5B has to move from 0V to −10V.

To make the best use of available RDS with minimum distortion, it is possible to make full use of the available ranges of JFETs selecting particular types based on their typical minimum RDS for each of the series and shunt positions. Choice of appropriate mid-point potential divider resistances R5, R6 for shunt and R7, R8 for series is also important to mask any residual distortion. The JFETs used in this example are PMBFJ108 for Q1 with a typical minimum RDS of about 4R and MMBF4391 for Q2 having a typical minimum RDS of about 20R. The earpiece for this example has an impedance of 70R.

R7+R8 is set at approximately 10 times the minimum series RDS and so about 200R. Distortion for RDS greater than its minimum value is introduced through unwanted modulation of RDS from the signal passing though. R7 and R8 reduce the effect of this distortion. This does constrain the range of series resistance (in this example) from about 20R to 200R.

In this particular example the load impedance is only just over 10 times the minimum RDS of shunt JFET Q1 and so R5, R6 have been left as high values. However it is possible to select these so that the parallel combination of R5+R6 and the earpiece impedance is 10 times Q1 minimum RDS. As shown, the range of shunt impedance including load is about 4R to 70R.

In combination, the minimum attenuation is approximately 2.2 dB and maximum is approximately 32.2 dB. This gives a range of 30 dB, significantly more than most of the simple hearing protection devices based on JFETs on the market today.

The control voltages 5A, 5B have to be applied independently and a simple scheme would have 5A and 5B as complementary or algebraically summing to −10V. For minimum attenuation, 5A, 5B would then be 0V, −10V; maximum attenuation would have 5A, 5B at −10V, 0V. However better use of the series-shunt combination can be made to further reduce distortion, an advantageous feature of embodiments of the invention.

If it is most important to achieve the lowest distortion at very low levels of attenuation, as with first moving away from the point of minimum attenuation, the series control (5B) can be operated first as it is already in the range of RDS for minimum distortion. After some attenuation has been applied and distortion is less of a concern, shunt control can be applied via 5A.

If it is most important to achieve the lowest distortion over the full range of attenuation and steps of attenuation are each 1.5 dB or more, then it is possible to first operate the shunt control (5A) to rapidly "jump" through any residual distortion. The series control 5B can be applied later to achieve additional attenuation range.

Thus by intelligent independent use of the series and shunt controls, it is possible to achieve a good range of attenuation with minimal distortion of the signal.

Generating Gate Control Voltages

Whilst pulse-width-modulation (PWM) provides a relatively simple means of establishing a relatively high control voltage range when driven by a microcontroller, it still can represent too much power dissipation in some applications, due to the microcontroller itself. This could be made to operate at low frequencies for minimal power, but usually this is very inefficient in terms of processing power.

An advantageous option according to embodiments of the invention is to make the PWM intermittent, operating just long enough to charge a capacitor so as to establish a control voltage and then switching off to leave the capacitance maintaining control. The ability to hold a steady control voltage will be compromised by leakage currents and so the off period will have to be set appropriately for these and the degree of steadiness required for a given application.

Figure 10:
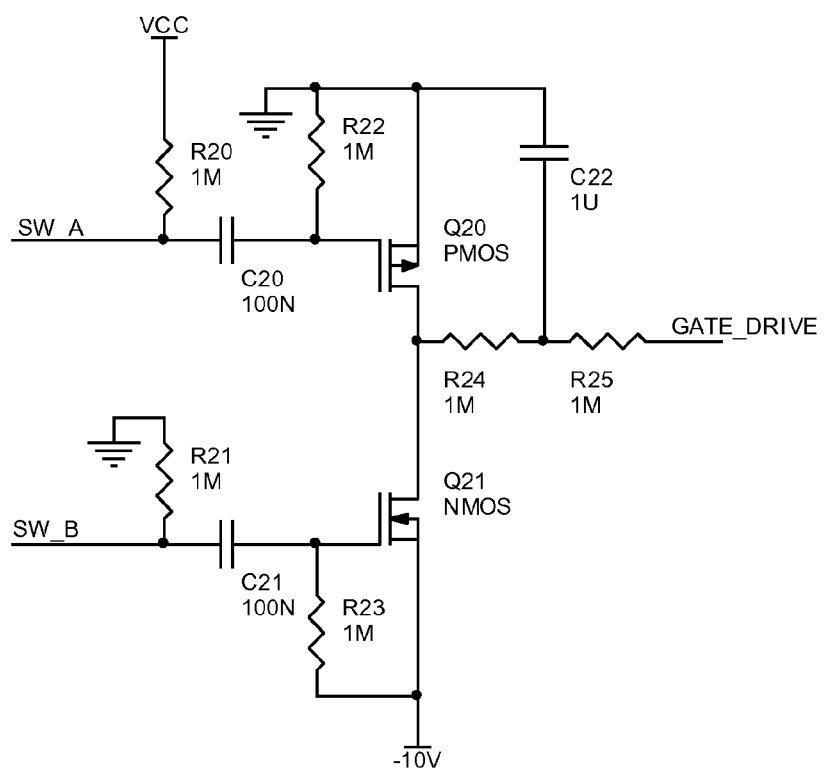
FIG. 10 shows another arrangement of a gate driver for generating JFET gate voltages with pulse-width-modulation.

FIG. 10 shows an arrangement suitable for regulated power supplies. Q20 and Q21 are normally held in their off state through R22, R23. R24, R25 and hence present C22 with a very high impedance. If SW_A and SW_B are the output pins of a microcontroller and are in a high impedance state, they will be pulled to VCC and ground respectively. This will be the case where the microcontroller is off, or when its input-output pins for SW_A and SW_B are either set as inputs.

Momentary grounding of SW_A will cause Q20 to pulse on, drawing the voltage on C22 towards ground. At another time, a momentary raising SW_B to VCC will cause Q21 to pulse on, drawing the voltage on C22 towards −10V. Using a similar pulse scheme to that used in half bridge motor drives, it is possible to control the level of GATE DRIVE between 0V and −10V with very little power being expended. Careful selection of the MOSFETs Q20, Q21 will help reduce any power consumed in switching. As with motor drive circuits, it is important to introduce gaps between the SW_A and SW_B pulses so that only one MOSFET is on at any time. This is a standard feature with some microcontrollers such as the Microchip nanowatt series (eg. PIC16LF1847)

This arrangement can be adapted for unregulated power supplies, potentially further reducing the overall power dissipation. It requires the rate of change of the power supply output to be sufficiently slow compared with the period between the microcontroller being awake and actively engaged in controlling the gate voltages. The arrangement of FIG. 10 has been adapted in FIG. 11 to illustrate one such arrangement. R26, R28 provide a representation of the nominal −12V supply as VN within the range that a microcontroller can access with its integral analogue to digital converter (ADC). This enables the control of the SW_A, SW_B pulse scheme to take account of the immediate value of supply voltage. It does require knowledge of VCC which can usually be measured quite simply by a microcontroller with internal voltage reference. VCC can be replaced by any voltage or voltage reference that shifts VN into the accessible voltage range for the microcontroller's ADC. The value of VN is given by:

$$VN=(VCC \times R28-VSUPPLY \times R26)/(R26+R28)$$

Such an intermittent PWM arrangement enables relatively large slew rates in either direction whilst achieving minimal power dissipation due to lack of linear amplifiers, the avoidance of regulated power supplies, and the microcontroller able to switch off.

Using an inverting micropower operational amplifier, the voltage VN can be made to be dependent on the negative supply only and thus simplifying the computation of appropriate settings for the PWM arrangement to compensate for supply variation; however this is at the cost of additional components and power consumption.

Figure 11:
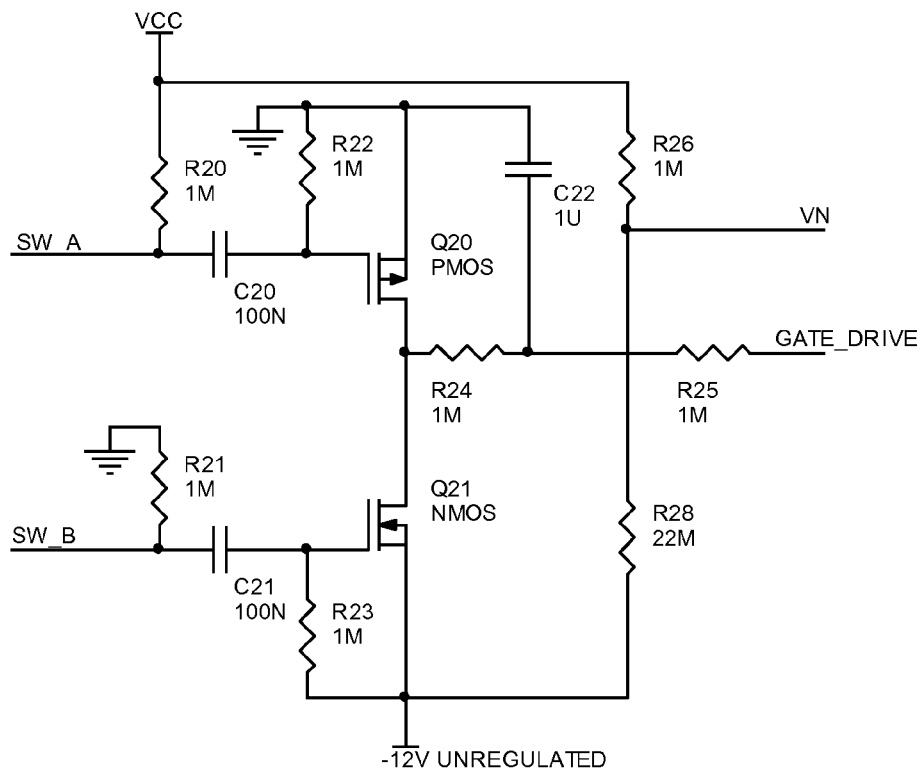
FIG. 11 shows an arrangement of a gate driver for generating JFET gate voltages with intermittent pulse-width-modulation.

In one embodiment of a complete microcontroller and JFET based attenuation system for the lowest possible power consumption, the microcontroller can be programmed to wake up every second, determines what the negative supply voltage is though converting VN of FIG. 11 and another conversion to obtain VCC. Based on the desired control voltage, the microcontroller can generate a few cycles of pulse-width modulation by periodically connecting SW_A to ground or SW_B to VCC. It can then revert to sleep for the remainder of the 1 second period to conserve power. With SW_A and SW_B switched to inputs when not used, this ensures the charge on C22 is maintained for the intervening period. This scheme represents an ultra-low power means of controlling an attenuator based on JFETs, whilst using a low number of relatively low-cost components. The only power consumption involved is an intermittent operation of the microcontroller, switching losses, the unregulated power supply, and the current drain due to leakage currents and R26, R28. It is also relatively simple to integrate onto a chip to further reduce size and cost.

Leakage currents can be significantly reduced with guard bands around the areas where the control voltage is maintained. For a system with control range 0 to −10V, a reasonable compromise could be with a −5V guard band established with 2 very high resistances such as 22M. Careful PCB layout and appropriate solder masks and additional coatings can also reduce leakage. If the microcontroller is to be asleep for extended periods of time, it is prudent to either provide a high impedance leakage path from C22 to ground, or to periodically pulse SW_A for an extremely short period to ensure C22's charge does not drift in an uncontrolled direction.

Reducing Device Variability

Where MOSFETs are used as the attenuation control devices, it is advantageous to ensure accurate matching of the control voltage to the particular device characteristic. This is because a typical MOSFET RDS changes very rapidly with respect to the gate-to-source control voltage.

There is the added complication of the integral diode to substrate which tends to rectify the signal passing through the attenuator.

Figure 12:
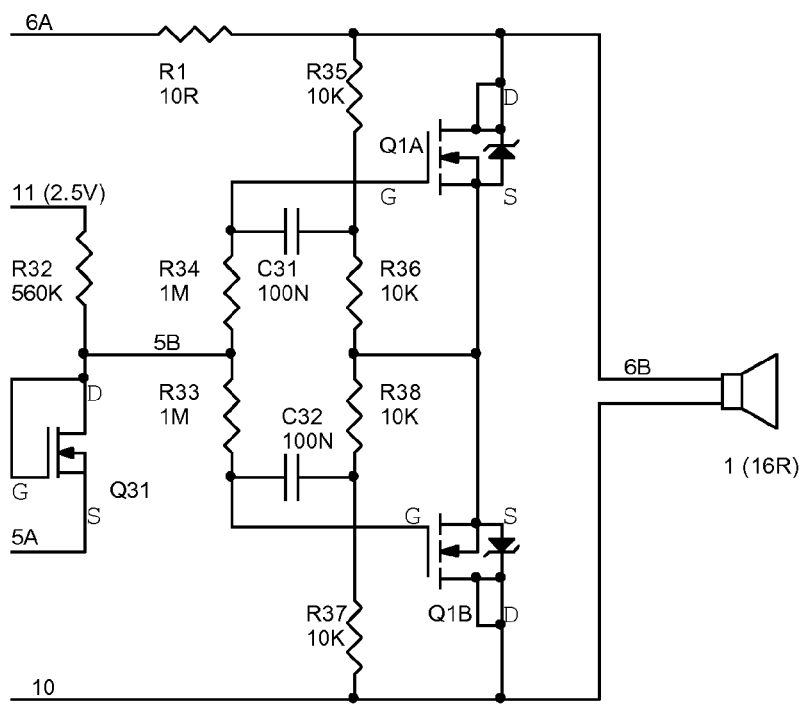
FIG. 12 shows an improved compensation arrangement for a symmetric MOSFET attenuator configuration.

The advantageous arrangement shown in FIG. 12 deals with both the production variations and asymmetric signal handling. Ideally, Q31 is from the same production batch as Q1A, Q1B, or on the same substrate. The control voltage at 5A approximately starts from zero, with Q31 being connected in a diode configuration provides an appropriate offset to almost turn on Q1A, Q1B. The linearization scheme has already been described with regard to the more simple representation of FIG. 7.

R32 provides a bias current to the diode-connected (G and D connected) MOSFET Q31. R32 could be replaced by a current source in another embodiment of this invention. Q31 provides the reference voltage which matches that of Q1A, Q1B for process (fairly closely) and temperature (very closely).

Using the above arrangement as shown in FIG. 7, it is possible to provide appropriate compensation for production spread, temperature shifts and basic MOSFET asymmetry in one simple configuration.

A similar scheme could be utilised for JFET devices, but their control of RDS characteristics are less rapid than those for MOSFETs and they are not commonly available as dual devices.

For either JFET or MOSFETs, it is possible to include a calibration scheme within the microcontroller, even including temperature compensation if necessary. During manufacture of the hearing protection device, a relatively simple calibration scheme can be used to capture enough of the deviation in a particular device to ensure sufficient control of attenuation is achieved.

Figure 1:
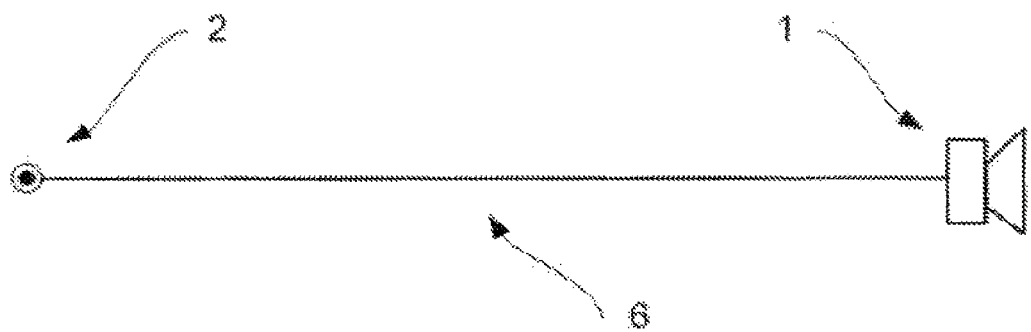
FIG. 1 shows an unprotected hearing device (1) with connector (2) and lead with electrical signal (6) driving the hearing device such as an earpiece, earbud, in-ear monitor (IEM), headphone, or headset.
Figure 2:
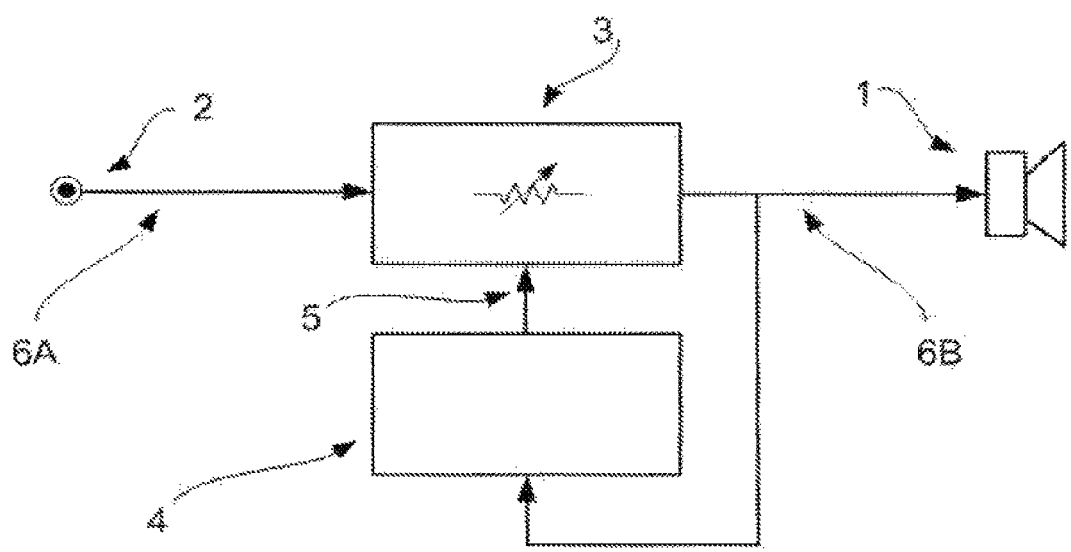
FIG. 2 shows one embodiment of this invention as being incorporated into the lead (6A, 6B) between a hearing device (1) and its connector (2). A controlled attenuation (3) with its controlling signal (5) is able to reduce the level of input to the device (6A) to produce a driving signal (6B) feeding the hearing device (1). The processing element (4) determines the degree of attenuation from a function of past inputs to the hearing device (6B) and the target limit.

As the basic configuration as shown in FIG. 2 is a closed loop system, errors in the attenuation control section are compensated for if the system accurately measures hearing dose.

Where a rapid response to large signals is an aspect of the device, more accurate calibration or knowledge of the control characteristic is advantageous as it has to work faster than the feedback from long-term dose monitoring.

Optimising Operation During Loss of Power Source

Whatever the power source is, there is the possibility of it becoming too low or failing. One feature of embodiments of this invention is fail-safe operation in the event of power loss as the controlled attenuator is being relied on for safe hearing. There are 2 approaches to this problem covered in this application; JFETs will have minimum RDS with power loss, whilst MOSFETs will have maximum RDS.

In FIG. 8, careful selection of the series and shunt JFET can determine an appropriate level of fixed attenuation in the case of power loss. In the figures quoted in the above section, the series JFET can have a minimum RDS of 20R whilst the shunt JFET can have 4R. With power loss, JFETs will settle to minimum RDS and so in this example will introduce a fixed attenuation of about 14 dB. This can be altered through selection of another type of JFET. There will be some tolerance due to the manufacturing spread of RDS minimum for any one type.

Figure 5:
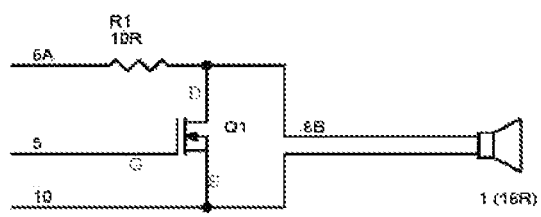
FIG. 5 shows prior art of a basic voltage-controlled attenuator configuration providing variable attenuation configuration. Terminals of MOSFET Q1 are drain (D), gate (G) and source (S).
Figure 13:
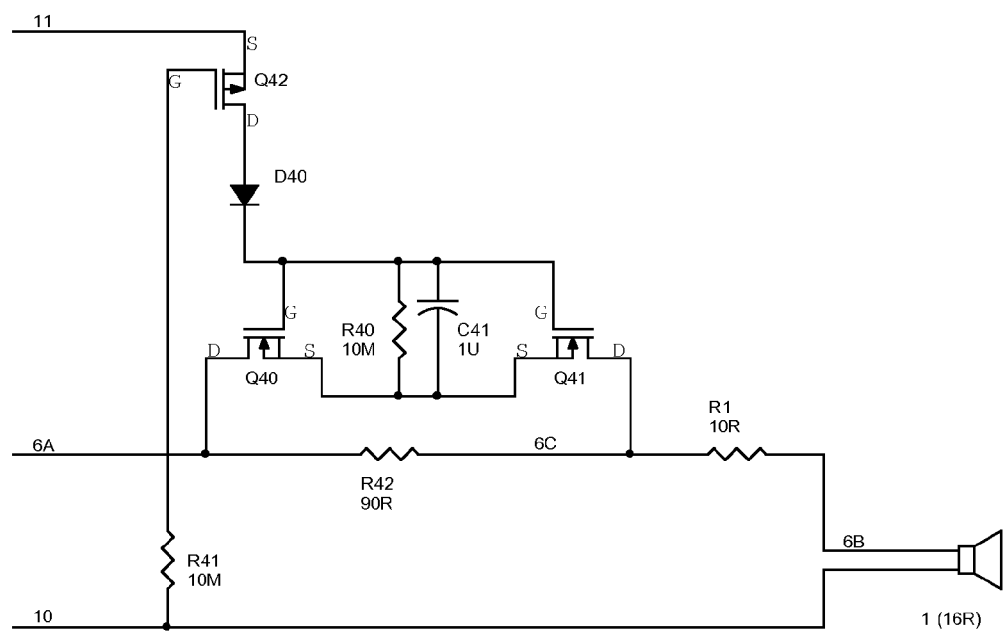
FIG. 13 shows an arrangement to ensure additional attenuation is introduced if power loss occurs.

In FIG. 13, an additional MOSFET network is introduced at the input to the voltage controlled attenuator. This is most easily understood with respect to FIG. 5, the most simple representation of controlled attenuator, although is applicable to any other configuration especially where MOSFETs are used as the attenuation device. FIG. 13 omits the attenuating MOSFET of FIG. 5 for clarity.

Q40, Q41 act as a switch which when on applies a short circuit (actually a few milliohms) between each devices D-S terminals and hence across R42. In this mode, the actual input (6A) is effectively connected to 6C and the attenuation is defined by the earpiece impedance (1) and R1. When Q40, Q41 are switched off, there is high impedance between their D-S terminals and R42 is effectively in series with R1. This applies additional attenuation with the signal amplitudes of 6A, 6C and 6B being related as:

$$|6A|>|6C|>|6B|$$

The power supply (11) being present ensures Q42 is on; if the supply fails, Q42 turns off. Q42 will be N-channel for a positive supply as shown in FIG. 13, but this could be altered for negative supplies if required. When Q42 is on, C41 is charged through D41 which biases Q40, Q41 on. If Q42 is off, C41 discharges through R40 and Q40, Q41 turn off to introduce the additional attenuation.

It is preferable to use both Q40 and Q41 as the switch combination to ensure adequate attenuation for large positive and negative excursions of the input signal (6A) as described previously. This arrangement ensures Q40 and Q41 are held off when the power supply is present, even if the input signal exceeds the power supply voltage.

D41 ensures that positive signal excursions do not cause Q42 to effectively become a diode connecting C41 to the supply. A PMOS device will act as a diode if the drain terminal is more than approximately 0.5V more positive than the source terminal.

Figure 3:
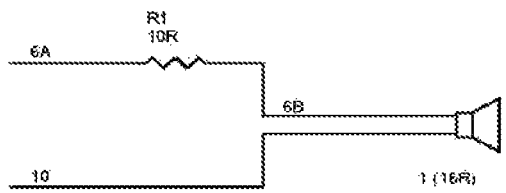
FIG. 3 shows prior art for a fixed attenuator configuration. 6A, 6B, 1 are as before. 10 is ground or common terminal. Typical values of impedance for moderate attenuation are shown.
Figure 4:
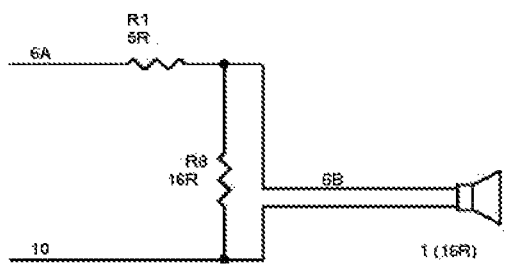
FIG. 4 shows prior art for reducing attenuator variability due to variations in earpiece impedance or high values of its source impedance (R1).

In both these schemes, (JFETs and FIG. 8, MOSFETs and FIG. 13) the additional attenuation introduced in the case of power-loss is equivalent to many existing fixed-attenuation solutions designed to limit the acoustic output of earpieces such as are illustrated in FIG. 3. It is an important feature of embodiments of this invention that the minimum insertion loss, or minimum attenuation in normal operation, is low so that short-term high-level signals can be delivered to the earpieces within the context of hearing dose management. This is why additional attenuation is introduced in the event of power failure. These 2 approaches to manage power loss can be applied appropriately to all other embodiments of this invention.

In another embodiment of this invention, the configuration for added attenuation of FIG. 13 could also be used to provide additional attenuation during normal use with power intact. This provides added protection for both the hearing protection device and hearing if the input level was vastly in excess of the attenuation capabilities on the voltage-controlled attenuator. This could be used with either the JFET or MOSFET variants of attenuator.

Hearing Dose Management

Figure 14:
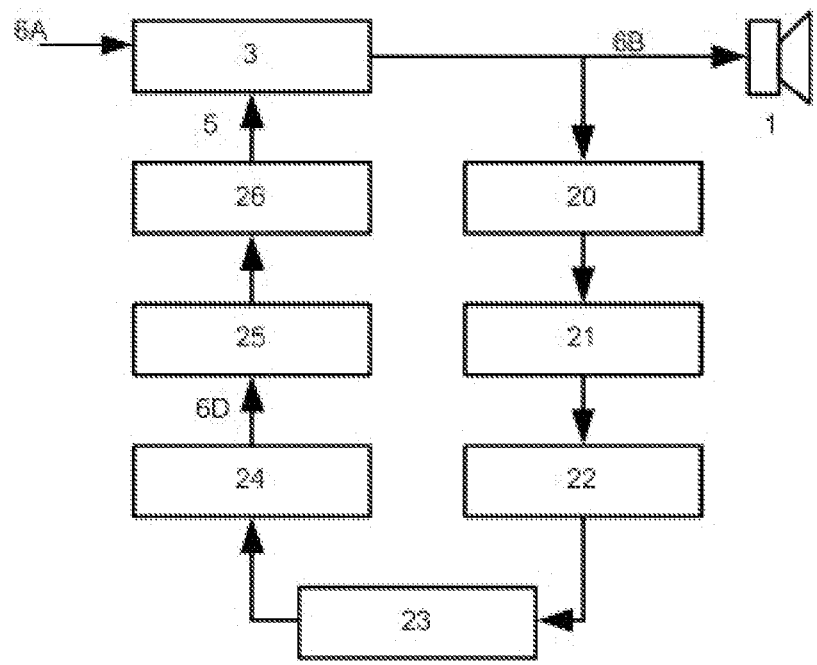
FIG. 14 shows an embodiment of the invention, providing the basic control algorithm configuration.

The embodiments described so far supports the overall task of hearing dose management. FIG. 14 illustrates all of the functionality involved. The input signal from source (6A) and the attenuated output signal (6B) to the earpiece (1) have been described previously. It is advantageous if the following functions are included so that the lowest power, highest safe signal level and lowest distortion can be achieved.

Many of the embodiments have been directed at the lowest possible power consumption. This generally requires the use of low-power analogue circuitry to undertake some of the functionality that could otherwise be performed in a relatively power-hungry DSP device.

Referring to FIG. 14: An A-weighted filter (20) ensures hearing dose measurement matches the regulatory requirement. A-weighted filters tend to ignore low frequencies which are known to be less harmful than those between 1-10 KHz.

In embodiments of this invention the filter (20) can have a modified frequency characteristic to compensate for non-uniform characteristics of earpiece (1). This will ensure better matching of delivered hearing dose with safe and regulatory limits at all frequencies.

Significant power saving can be achieved through analogue detection (21) and averaging (22) to replicate root-mean-square (RMS) conversion. This is followed by digitisation (23).

With some analogue averaging (22) the microcontroller can be asleep for relatively long periods such as a few hundred milliseconds. A DSP would have to digitise at a rate of tens of kilohertz resulting in very much more processing and the need to always be running.

If rectification and averaging are performed in analogue, it is necessary to square (24) the digitised result to represent power rather than voltage. SPL is a measure of signal power rather than intensity.

Through the use of a set of averaging or temporal filters (25), the hearing dose over recent history can be determined with minimal data storage requirement.

The combined output of the temporal filters is combined with a set of calibration factors (in 26) to generate the control signal (5). This generates the control signal for attenuator (3).

Figure 15:
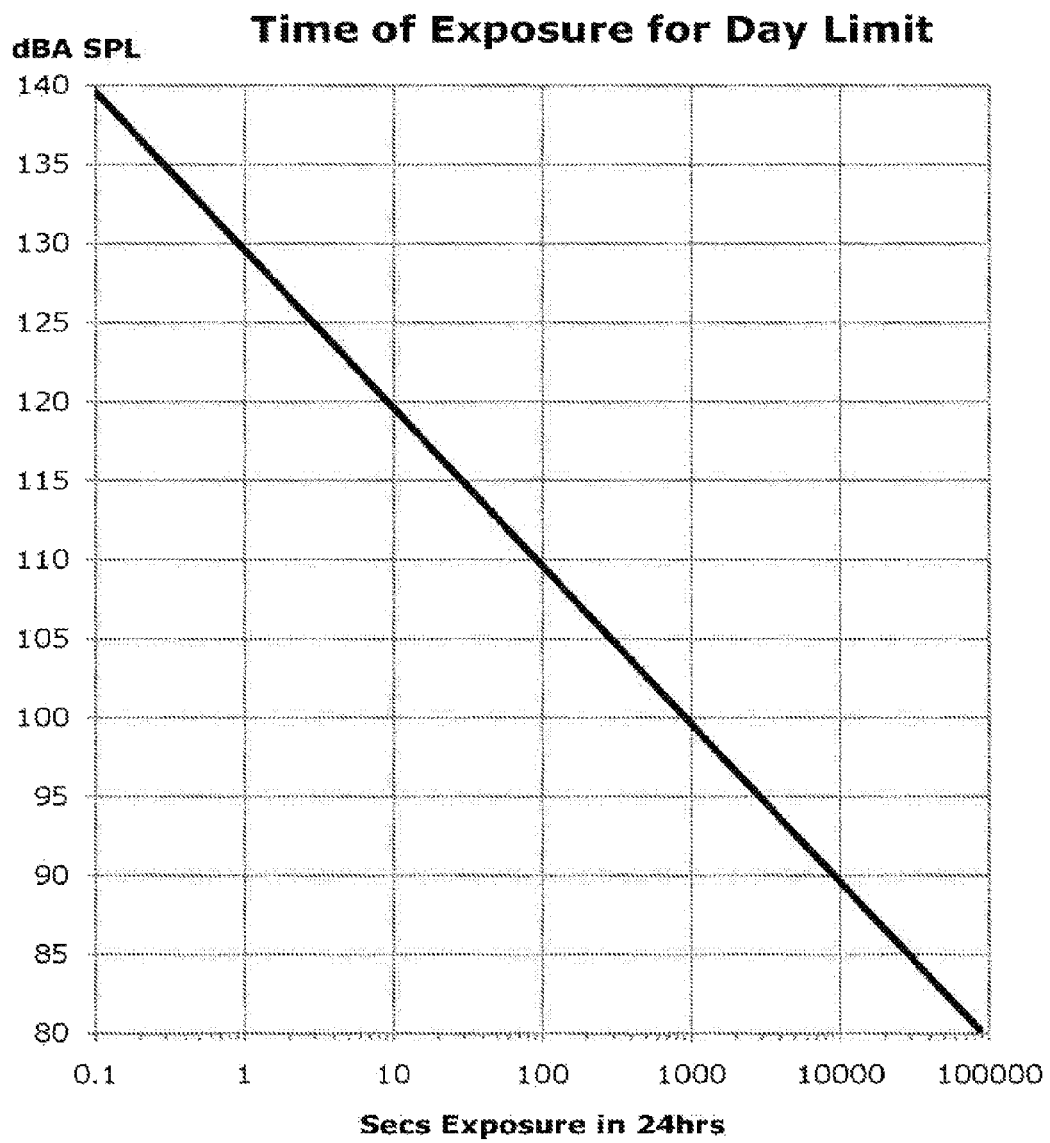
FIG. 15 illustrates the EU dose limits for a single day.

FIG. 15 illustrates the EU dose limits for a single day in a way that shows the scope for short-term high level sound levels as well as long-term moderate noise levels. It indicates that 80.2 dB SPL can be sustained indefinitely (8,640 seconds is 24 hours), 85 dB SPL can be sustained for 8 hours (28,800 seconds) and 110 dB SPL can be sustained for just under 100 seconds. Thus the aim is to ensure hearing dose over a day is always constrained to the left of the diagonal line. It is necessary to ensure reasonable capacity is available for unexpected dose at some future point.

The 85 dB and 110 dB limit examples assume that there is no significant noise exposure outside this time during the 24 hour period. In practise, 110 dB is possible for only a much shorter period than 100 seconds, and any automatic exposure limiting measures have to begin being applied well in advance, such as after only a few seconds.

Noise dose related legislation is based on equivalent dose levels per day, with an alternative of equivalent dose based on 5 days averaged over a week. The US based legislation is similar to the EU and other legislation, with minor differences.

To keep the noise protection device as simple as possible to use, embodiments of this invention employ a rolling average over 24 hours to estimate the dose and take effective control measures. This means that absolute time does not need to be known by the device, which can rely on elapsed time instead. Although there are technical differences between the two schemes, these are in practice negligible. For this to be implemented in full, the last temporal filter has an averaging period of 24 hours.

One interpretation of the EU legislation is for the dose to be averaged over a working week, with 85 dBA SPL being the maximum dose allowed over 40 hours or 5 days of 8 hours or the equivalent. It is possible to adapt the rolling average scheme for a whole week, with the final temporal filter having a 7-day operational period.

When significant levels are being detected in any of the temporal filters, a suitable warning can be given to the user. This can be either via visual illumination (and LED flash) or audible (via a suitable bleep injected into the audio signal). Such a warning is intended to encourage the user to turn down the source signal level. If the warning is not heeded and it becomes necessary to attenuate the signal, this will be done automatically using the algorithm described above.

Where stereo operation is required, each earpiece can be monitored and controlled independently. However, an improved hearing experience is ensured by independent monitoring the 2 channels and common application of attenuation based on the highest level channel; this will in most situations have only marginal reduction in the maximum possible safe acoustic level being delivered to the ears.

Acoustic Shock Protection

Noise related legislation covers dose and peak levels. There is evidence of some noises inducing what is known as acoustic shock, even though these limits have not been exceeded. This is believed to be dependent on the sound level, the particular sound involved, and the condition of the hearer. There is no known definition of the range of noise events that need to be excluded so as to avoid acoustic shock and yet allow reasonable levels of audibility. Some sounds can be detected through digital signal processing (DSP) techniques and suppressed in conjunction with delaying the audio signal.

A simple means of addressing some of the noise events that contribute to acoustic shock is to provide rapid management of high signal levels that have not yet resulted in dose being accumulated and are not high enough to be clipped or limited by any instantaneous device such as cross-coupled diodes or more sophisticated clamping circuits.

Physical Implementation

Embodiments of this invention incorporate the dose management device with the earpiece set. Preferably this would be in a small case mounted in the earpiece leads near the connector. This allows visual indications to be most noticeable. Alternatively, this could be incorporated into connectors, push-to-talk switch housings, earpieces or headsets.

Another embodiment of this invention is to incorporate it in a separate housing with socket for the earpiece or headset, and a plug to connect into the source device.

Another embodiment of this invention is to incorporate it into the source device, especially where some recognition of any earpiece or headset type being connected is available.

According to aspects of the invention, there are provided limiting devices according to one or more of the following clauses.

1. A limiting device having an input and an output which feeds an acoustic transducer, with controlled attenuation between input and output dependent on past levels of the output so as to manage hearing dose delivered by the acoustic transducer [as shown in FIG. 2].
2. As per clause 1 where the attenuation is achieved with a configuration of at least 1 voltage or current controlled device such as a MOSFET or JFET.
3. As per clause 2 where linearization of a MOSFET or JFET control is achieved with capacitor coupling [as shown in FIG. 7].
4. As per clause 2 where a series-shunt arrangement of MOSFETs or JFETs is utilised to achieve greater ranges of attenuation at low distortion.
5. As per clause 4 with low distortion being achieved through independent control of the serial and shunt attenuating devices.

6. As per clause 4 when used with JFETs where selection of the series and shunt device on-resistance is used to determine the resulting attenuation if there is a loss of power supply.
7. As per any of the above clauses where a MOSFET network similar to that shown in FIG. 13 is used to automatically introduce additional attenuation in the event of a power-supply failure and thereby providing back-up protection for hearing dose.
8. As per clause 7 but where additional attenuation can be switched in under controlled conditions so as to augment the attenuation range attained with the arrangements described above to manage very high input signals.
9. As per the above clauses where the attenuating device gate control voltages are generated with pulse-width-modulation (PWM), whereby the PWM drive signals are switched to high impedance for periods to conserve power consumption.
10. As per the above clauses where the attenuating device gate control voltages are generated with PWM, whereby the PWM timing is modulated to compensate for fluctuations in a poorly regulated power supply.
11. As per the clause 2 where MOSFET attenuation networks in a back-to-back configuration similar to that shown in FIG. 12, using 3 or more closely matched MOSFETs where at least 1 is being used to compensate for the manufacture and temperature variations in the MOSFETs being used for attenuation.
12. An arrangement as per above clauses where low-power analogue circuitry is used for some signal conditioning so that relatively high power-consuming devices such as a DSP or microcontroller can be powered down for periods to minimise overall power consumption.
13. As per any of the above clauses whereby the A-weighted filter used in measuring hearing dose has a modified frequency response to compensate for non-uniform frequency responses of the earpieces.
14. As per any of the above clauses whereby the dose management process is based on a rolling day's average to provide continuous protection, rather than having a defined start period.
15. As per any of the above clauses where there is an option for the dose management process to operate on a rolling-week process to suit the week option in the relative legislation (and corresponding safe limits)
16. As per any of the above clauses whereby users are given a warning through either visual or audible indication of imminent increases in attenuation due to a potentially high hearing dose being received
17. As per any of the above clauses whereby calibration parameters determined and stored in the device to compensate for variations in the specific MOSFET or JFET characteristics
18. As per clause 17 but where the calibration parameters include compensation for the associated hearing device sensitivity, either based on averaged characteristics or from specific measurements on a single device.

Features and modifications of the embodiments described above can be combined and/or interchanged as desired.

The disclosures in British patent application no. GB 1114915.0, from which this application claims priority, and in the abstract accompanying this application, are incorporated herein by reference.

The invention claimed is:

1. A hearing dose management device having an input, an output for feeding an acoustic transducer, and an attenuating device configured to provide a controlled passive attenuation between the input and the output; wherein the attenuation is dependent on past levels of output dose, to manage a hearing dose delivered by an acoustic transducer.

2. A hearing dose management device according to claim 1, wherein the attenuating device comprises at least one voltage or current controlled device, optionally a MOSFET or JFET.

3. A hearing dose management device according to claim 2, wherein the at least one voltage or current controlled device is configured to be linearized with capacitor coupling.

4. A hearing dose management device according to claim 1, wherein the attenuating device comprises a plurality of voltage or current controlled devices, optionally MOSFETs and/or JFETs, arranged into a series-shunt arrangement to provide attenuation below a predetermined level of distortion.

5. A hearing dose management device according to claim 4, wherein the voltage or current controlled devices can be independently controlled to provide distortion below a predetermined level.

6. A hearing dose management device according to claim 4 wherein the voltage or current controlled devices are JFETs, and wherein the attenuation is determined by the on-resistance of the JFETs if there is a loss of power supply.

7. A hearing dose management device according to claim 1, wherein a MOSFET network capable of passing larger signals than a power supply is configured to automatically introduce additional attenuation in the event of a power-supply failure and thereby provide back-up hearing protection.

8. A hearing dose management device according to claim 7, further comprising a switch for switching in additional attenuation under controlled conditions to augment the attenuation range to manage input signals above a predetermined threshold.

9. A hearing dose management device according to claim 1, wherein the attenuating device is configured to receive gate control voltages which are generated with pulse-width-modulation (PWM), whereby the PWM signals are switched to a higher impedance for predetermined periods to conserve power consumption.

10. A hearing dose management device according to claim 1, wherein the attenuating device is configured to receive gate control voltages which are generated with pulse-width-modulation (PWM), whereby the PWM timing is modulated to compensate for fluctuations in a poorly regulated power supply.

11. A hearing dose management device as in claim 1 including MOSFET attenuation networks in a back-to-back configuration to handle bipolar audio signals, including at least 1 additional closely matched MOSFET to compensate for the manufacture and temperature variations in the MOSFETs being used for attenuation.

12. A hearing dose management device according to claim 1 including analogue circuitry for signal conditioning to enable one or more components, optionally a DSP or microcontroller, to be powered down for predetermined periods to minimise overall power consumption.

13. A hearing dose management device according to claim 1 further including an A-weighted filter for measuring hearing dose having a modified frequency response to compensate for non-uniform frequency responses of the earpieces.

14. A hearing dose management device according to claim 1 wherein the attenuation device is configured to manage the hearing dose based on a rolling day's average to provide continuous protection, optionally without a defined start period.

15. A hearing dose management device according to claim 1, wherein the attenuation device can be configured to manage the hearing dose based on a rolling-week process.

16. A hearing dose management device according to claim 1 configured to provide a visual or audible warning of imminent increases in attenuation due to a hearing dose being received which is potentially above a predetermined threshold.

17. A hearing dose management device according to claim 1, wherein the device has stored therein calibration parameters to compensate for variations in specific characteristics of the attenuation device.

18. A hearing dose management device according to claim 17 wherein the calibration parameters include compensation for the sensitivity of an associated hearing device, optionally based on averaged characteristics or from specific measurements on a single device.

19. A hearing dose management device according to claim 1, further including the acoustic transducer.

20. A method of hearing dose management performed by a hearing dose management device having an input, an output for feeding an acoustic transducer, and an attenuating device configured to provide a controlled passive attenuation between the input and the output: wherein the method includes the step of the passive attenuation being dependent on past levels of output dose, to manage a hearing dose delivered by an acoustic transducer.

\* \* \* \* \*